United States Patent
Zou

(10) Patent No.: US 7,111,123 B1
(45) Date of Patent: Sep. 19, 2006

(54) CIRCUIT AND METHOD TO ALLOW SEARCHING BEYOND A DESIGNATED ADDRESS OF A CONTENT ADDRESSABLE MEMORY

(75) Inventor: Janet Zou, Milpitas, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 149 days.

(21) Appl. No.: 10/202,526

(22) Filed: Jul. 24, 2002

Related U.S. Application Data

(60) Provisional application No. 60/343,973, filed on Dec. 27, 2001.

(51) Int. Cl.
*G06F 12/02* (2006.01)

(52) U.S. Cl. .................. 711/118; 711/100; 365/49; 370/395.42; 370/395.71; 370/395.72; 370/395.7

(58) Field of Classification Search ........... 370/392, 370/395.42, 395.7, 395.71–395.72; 365/49; 711/108, 141, 158, 118; 707/3; 709/238, 709/245
See application file for complete search history.

(56) References Cited

U.S. PATENT DOCUMENTS

| | | | |
|---|---|---|---|
| 5,497,488 A * | 3/1996 | Akizawa et al. ............... 707/6 |
| 5,877,714 A * | 3/1999 | Satoh ........................ 341/87 |
| 6,034,958 A | 3/2000 | Wicklund ................... 370/395 |
| 6,069,573 A * | 5/2000 | Clark et al. .................. 341/50 |
| 6,081,440 A | 6/2000 | Washburn et al. |
| 6,108,227 A | 8/2000 | Voelkel |
| 6,108,747 A * | 8/2000 | Kaganoi ..................... 711/108 |
| 6,240,000 B1 | 5/2001 | Sywyk et al. |
| 6,253,280 B1 | 6/2001 | Voelkel |
| 6,266,262 B1 | 7/2001 | Washburn et al. |
| 6,480,406 B1 | 11/2002 | Jin et al. |
| 6,502,163 B1 | 12/2002 | Ramankutty |

(Continued)

OTHER PUBLICATIONS

U.S. Appl. No. 10/271,660, James, David.

(Continued)

*Primary Examiner*—Matthew Kim
*Assistant Examiner*—Zhuo H. Li
(74) *Attorney, Agent, or Firm*—Bradley T. Sako

(57) ABSTRACT

A content addressable memory includes a priority encoder that is in communication with an array of the content addressable memory cells to receive match signals, and from the match signals generating an output index signal in accordance with a priority sequence of the match signals. The priority encoder has a plurality of input circuits to receive the match signals from the CAM array. A priority setting circuit receives a priority transformation signal indicating a priority index for modification of the priority sequence. An encoding circuit is in communication with the plurality of input circuits and the priority setting circuit for generating the output index signal in accordance with the priority sequence. The priority encoder circuit further includes an enabling circuit for receiving an enabling signal. The enabling circuit communicates the enabling signals to the encoding circuit, such that upon deactivation of the enabling signal, the encoding circuit generates the output signal in accordance with the priority sequence with no modification by the priority setting circuit. The priority index indicates a region of the content addressable memory exempted from effective comparison. This allows the CAM array to be searched for multiple matches of the comparand. The priority index thus is an index address of the content addressable memory determined with a previous search of the content addressable memory. The priority index is provided to the priority setting circuit through a word line decoder of the array of content addressable memory cells.

20 Claims, 9 Drawing Sheets

U.S. PATENT DOCUMENTS

| | | | |
|---|---|---|---|
| 6,504,740 B1 | 1/2003 | Voelkel | |
| 6,505,270 B1 | 1/2003 | Voelkel et al. | |
| 6,515,884 B1 | 2/2003 | Sywyk et al. | |
| 6,539,455 B1 * | 3/2003 | Khanna et al. | 711/108 |
| 6,647,457 B1 | 11/2003 | Sywyk et al. | |
| 6,661,716 B1 | 12/2003 | Sywyk et al. | |
| 6,697,275 B1 | 2/2004 | Sywyk et al. | |
| 6,721,202 B1 | 4/2004 | Roge et al. | |
| 6,751,755 B1 | 6/2004 | Sywyk et al. | |
| 6,757,779 B1 * | 6/2004 | Nataraj et al. | 711/108 |
| 6,763,426 B1 | 7/2004 | James et al. | |
| 6,772,279 B1 | 8/2004 | Sun et al. | |
| 6,804,744 B1 * | 10/2004 | Abbas | 711/108 |
| 6,845,024 B1 | 1/2005 | Wanzakhade et al. | |
| 6,876,558 B1 | 4/2005 | James et al. | |
| 6,892,273 B1 | 5/2005 | James et al. | |
| 2002/0007446 A1 * | 1/2002 | Stark | 711/158 |
| 2002/0032681 A1 * | 3/2002 | Feldmeier et al. | 707/3 |
| 2002/0161969 A1 * | 10/2002 | Nataraj et al. | 711/108 |
| 2002/0172065 A1 * | 11/2002 | Uzawa et al. | 365/49 |
| 2003/0005146 A1 * | 1/2003 | Miller et al. | 709/238 |
| 2003/0108043 A1 * | 6/2003 | Liao | 370/392 |

OTHER PUBLICATIONS

U.S. Appl. No. 10/320,049, James, David.
U.S. Appl. No. 10/286,198, James, David.
U.S. Apll. No. 10/286,199, Rajamanickam, Jagad.
U.S. Appl. No. 10/281,814, James, David.
U.S. Appl. No. 10/264,667, James, David.
U.S. Appl. No. 10/264,668, Rajamanickam, Jagad.
U.S. Appl. No. 10/329,146, James, David.
U.S. Appl. No. 10/266,953, Wanzakhade, Sanjay.
U.S. Appl. No. 10/320,588, Wanzakhade, Sanjay.
U.S. Appl. No. 10/320,053, Wanzakhade, Sanjay.
U.S. Appl. No. 10/873,608, Meng, Anita X.
U.S. Appl. No. 10/746,899, Om, Hari.
U.S. Appl. No. 11/000,568, Smith, Scott.
U.S. Appl. No. 11/011,464, Smith Scott.
U.S. Appl. No. 10/897,062, Venkatachary, Sriniv.
U.S. Appl. No. 10/940,129, Narum, Steven.
U.S. Appl. No. 10/950,323, Birman, Mark.
U.S. Appl. No. 10/977,516, Om, Hari.
U.S. Appl. No. 11/014,123, Om, Hari.
U.S. Appl. No. 11/043,391, Gupta, Pankaj.
U.S. Appl. No. 60/612,905, Venkatachary, Sriniv.
U.S. Appl. No. 60/663,656, Maheshwari, Dinesh.
U.S. Appl. No. 60/661,745, Maheshwari, Dinesh.
U.S. Appl. No. 60/657,754, Maheshwari, Dinesh.
U.S. Appl. No. 60/629,694, Jiang, Bin.
U.S. Appl. No. 60/666,875, Maheshwari, Dinesh.
U.S. Appl. No. 11/085,399, Om, Hari.
U.S. Appl. No. 11/089,837, Smith, Scott.
U.S. Appl. No. 60/667,325, Om, Hari.
U.S. Appl. No. 10/217,746, Chou, Richard.
U.S. Appl. No. 11/090,116, Banachowicz, Bartosz.

* cited by examiner

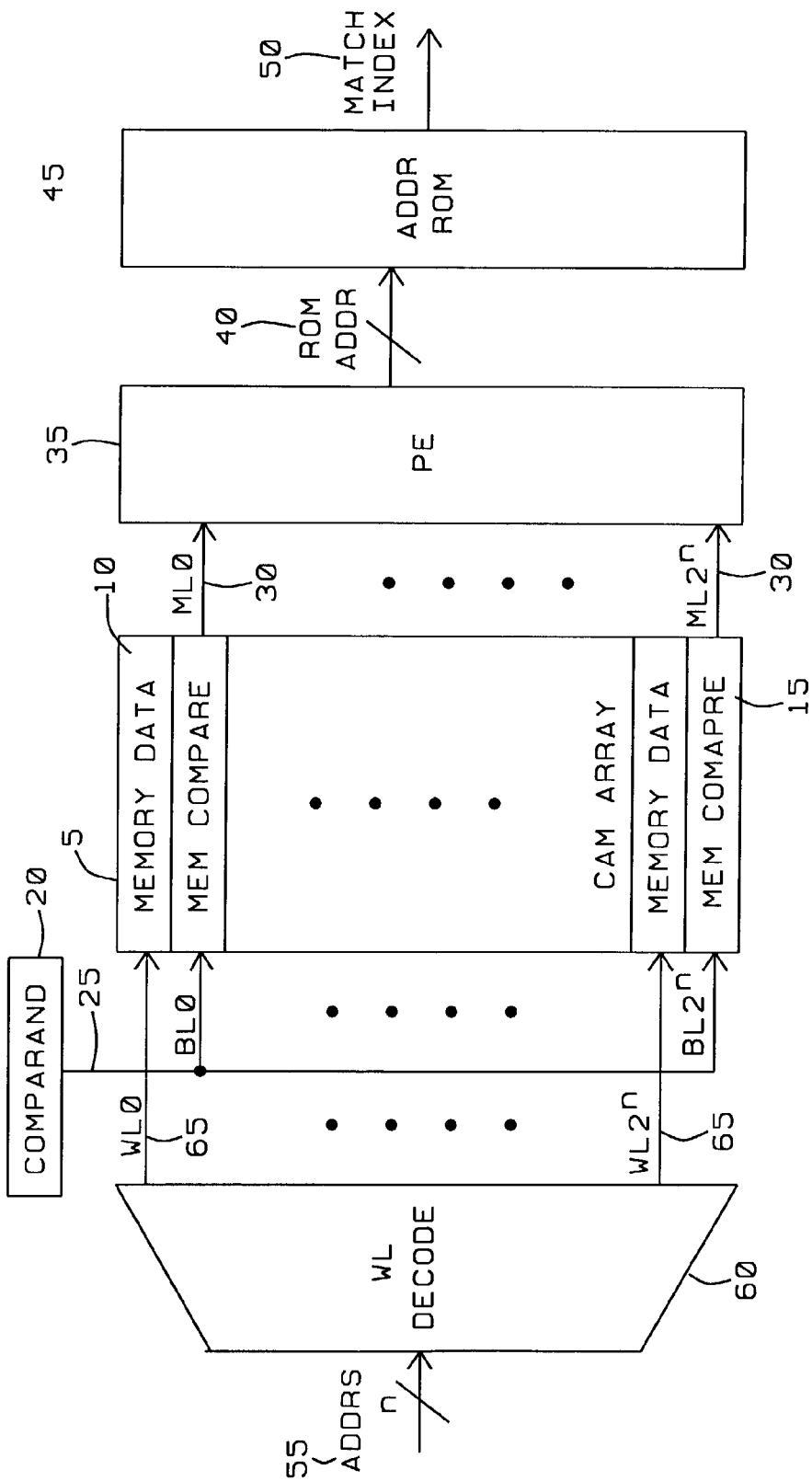
FIG. 1
(CONVENTIONAL)

CIRCUIT AND METHOD TO ALLOW SEARCHING BEYOND A DESIGNATED ADDRESS OF A CONTENT ADDRESSABLE MEMORY

The present application is related to and claims benefit of priority of the filing date of U.S. Provisional Patent Application entitled "Search Engine Architecture and Method", assigned Ser. No. 60/343,973, filed Dec. 27, 2001, and herein incorporated by reference.

BACKGROUND OF THE INVENTION

1. Field of the Invention

This invention relates to priority encoding circuits. More particularly, this invention relates to priority encoding circuits within a content addressable memory having a programmable priority index.

2. Description of Related Art

Content addressable memory (CAM) is well known in the art and is employed in applications such as "search engines" in bridge circuits of network routers. A message arrives at the bridge circuit and a destination address is extracted from the message. The address is compared to a database of addresses maintained in a CAM structure. When the address is found within the CAM, the CAM returns an index pointing to the appropriate link leaving the router. The message is then transferred on the link to the next router or the destination. The destination address may in fact match multiple entries within the CAM and for certain addresses or applications it may be desirable for the all the indices to be accessed.

Refer now to FIG. 1 for a discussion of the operation of a CAM of the conventional art. The CAM array 5 is composed of rows of CAM cells 10, which contains the data to be compared against. Each row of CAM cells 10 has an associated compare circuit 15 to simultaneously compare a comparand data 20 to the contents of each row of CAM cells 10. The comparand data 20 is transferred to all the comparators 15 through the bit lines 25 or other comparand lines (not shown) connected to the CAM cells 10 and the comparators 15 of the CAM array 5.

The result from each compare is indicated by the state of each of the match result lines 30. The "match line" passes through the CAM cells of the CAM array 5 along a row. The match lines feed into match line sense amplifiers to produce digital hit or miss indications. Only those match result lines 30 connected to the CAM cells 10 having comparison data matching the comparand data 20 are activated. The match result lines are the inputs to a priority encoder circuit 35. A priority encoder circuit, as is known in the art, provides an output containing a code indicating which of the input lines that are active based on a predetermined priority or precedence. In this circuit, the output lines 40 of the priority encoder 35 provide a Read Only Memory (ROM) address selection dependent on the match result lines 30 having the highest priority or precedence. Traditionally, this would indicate the address having the least magnitude. Obviously, other orders of precedence may be chosen. The output lines 40 of the priority encoder 35 are the address lines for the index ROM 45. The contents of the index ROM 45 are the indices pointing to the locations designated for the corresponding locations of the CAM array 5. The activate output line 40 of the priority encoder 35 causes the contents of the index ROM 45 to be placed at the match index output lines 50 of the index ROM 45. The match index 50 is then transferred to external circuitry for further processing.

The data contents of the rows of CAM cells 10 are written with the data being placed on the bit lines 25 just as the comparand 20 is driven active during a compare operation. The CAM array may include mask cells associated with the CAM cells 10. The mask cells and the associated CAM cells 10 comprise what is referred to as "ternary" CAM cells. A CAM array having only the CAM cells 10 is referred to as a "binary" CAM array. Upon placement of the data on the bit lines 25 or other comparand data lines (not shown), the address 55 is applied to the word line decoder 60. The word line decoder 60 interprets the address 55 to select the word line 65 attached to the row of CAM cells 10 into which the data may be written. If the row of CAM cells 10 includes mask cells, the cells may be masked to create a "don't care" state for those CAM cells.

Attendant with the memory data are flags indicating validity of the data, whether the data is to be ignored in the search, and other information regarding the data. These flags maybe physically part of the rows of memory cells 5 or separate in registers or random access memory (RAM) accessible with either the match lines or with the match index or with associated signals.

The ignore flag is used when all matches in the CAM array 5 to a comparand 20 are to be found. All of the matches for the comparand are identified and the resulting identification location transferred from the CAM array 5 by iteratively searching the CAM array 5. During the first iteration, the match having the highest precedence is identified and the ignore flag is set for the row of CAM cells 10 and a second search is performed and the next match with the next highest precedence is identified, since the match with the highest precedence is ignored. The process is repeated until all the matches within the CAM array 5 are identified. This process requires maintaining a listing of the match indices and from that listing setting the ignore flags and then resetting the ignore flags prior to a subsequent operation that is not a search with the same comparand. In some applications, it maybe desirable to allow searches for the presence of other comparands before determining the other matches for the original comparand. This forces the skip flags to be set and reset depending on which comparand 20 is being applied to the CAM array 5. The setting and resetting of the ignore flags cause extra processing and circuitry to maintain which of the rows of CAM cells 10 are to be ignored during particular searches.

U.S. Pat. No. 6,034,958 (Wicklund) describes an efficient approach to Asynchronous Transfer Mode (ATM) connection table lookup that minimizes the number of tables and memory lookups through the use of hash coding and binary table search techniques. The virtual connection information associated with an incoming ATM cell is hash coded. The hash code provides a compressed representation of the virtual connection information. This allows the address space of a table accessed based on the hash code to be much smaller than the maximum number of possible virtual connection combinations that can be encoded in the ATM cell header without restricting the set of possible virtual connection combinations. A binary search based on the cell's virtual connection information can be used to efficiently select, from plural records accessed based on the hash code, the particular search record corresponding to the cell's connection.

SUMMARY OF THE INVENTION

An object of this invention is to provide a circuit for restricting a search address space in a content addressable memory.

Another object of this invention is to provide a priority encoder where the priority is modified to restrict certain input lines from being selected for encoding.

To accomplish at least one of these and other objects, a content addressable memory includes a priority encoder. The priority encoder is in communication with an array of content addressable memory cells to receive match signals, and from the match signals generates an output index signal in accordance with a priority sequence of the match signals. The priority encoder has a plurality of input circuits to receive the match signals from the CAM array. A priority setting circuit receives a priority transformation signal indicating a priority index for modification of the priority sequence. An encoding circuit is in communication with the plurality of input circuits and the priority setting circuit for generating the output index signal in accordance with the priority sequence. The priority encoder circuit further includes an enabling circuit for receiving an enabling signal. The enabling circuit communicates the enabling signals to the encoding circuit, such that upon deactivation of the enabling signal, the encoding circuit generates the output signal in accordance with the priority sequence with no modification by the priority setting circuit.

The priority index indicates a region of the content addressable memory effectively exempted from comparison. This allows the CAM array to sequentially provide multiple matches of the comparand. The priority index thus is an index address of the content addressable memory, which may be determined by a previous search of the content addressable memory. The priority index is provided to the priority setting circuit through a word line decoder of the array of content addressable memory cells.

BRIEF DESCRIPTION OF THE DRAWINGS

FIG. 1 is block diagram of a content addressable memory of the conventional art.

DETAILED DESCRIPTION OF THE EMBODIMENTS

Figure 2:
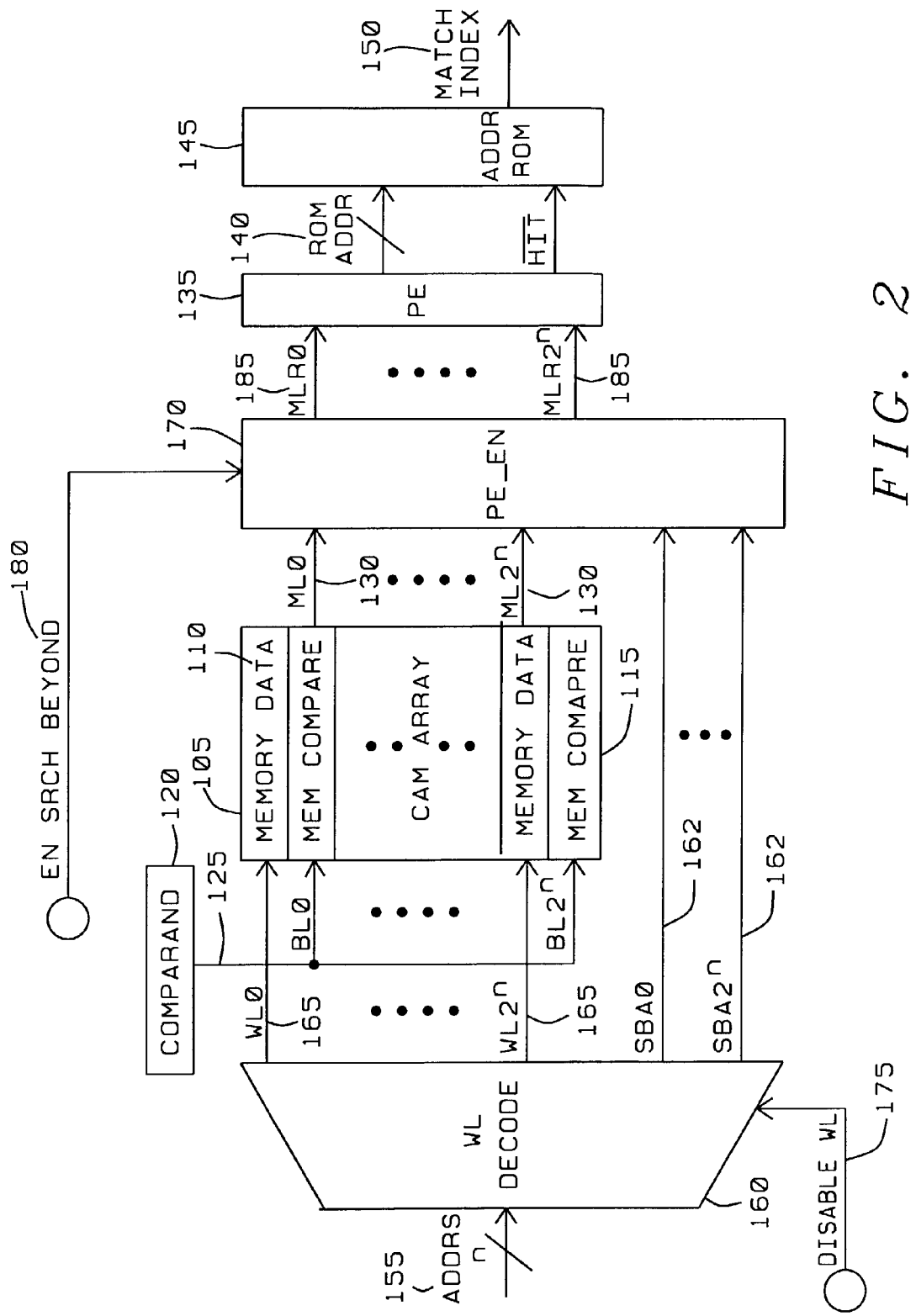
FIG. 2 is block diagram of a content addressable memory according to an embodiment of this invention.

The fundamental structure of the CAM array of this invention is as described above and illustrated in FIG. 2. The CAM array 105 is composed of rows of memory cells 110, which is to contain the data to be compared against. Each row of memory cells 110 has an associated compare circuit 115 to simultaneously compare a comparand data 120 to the contents of each row of memory cells 110. The comparand data 120 is transferred to all the comparators 115 through the bit lines 125 or other comparand data lines connected to the memory cells 110 and the comparators 115 of the CAM array 105.

The result from each compare is indicated by the state of each of the match result lines 130. Only those match result lines 130 connected to the memory cells 110 having cell data matching the comparand data 120 are activated. The match result lines 130 are the inputs to the priority restriction circuit 170. If the Enable Search Beyond signal 180 is not activated, the priority restriction circuit 170 transfers the match result lines 130 to the restricted match result lines 185. The restricted match result lines 185 are the inputs to a priority encoder circuit 135. A priority encoder circuit 135 provides an output containing a code indicating one of the restricted match result lines 185 that are active based on the priority or precedence constructed in the basic design. In this circuit, the output lines 140 of the priority encoder 135 provide an address code dependent on the match line 130 having the highest priority or precedence. Traditionally, this would indicate the address having the least magnitude. Obviously, other orders of precedence maybe chosen including an individualized programmed priority. The output lines 140 in this illustration have a one-to-one correspondence to the restricted match result lines 185 with only the unrestricted line having a match and having the highest precedence being activated. The output lines 140 of the priority encoder 135 are the address lines for the index ROM 145. The contents of the index ROM 145 are the indices pointing to the locations designated for the corresponding location of the CAM array 105. The activated output line 140 of the priority encoder 135 causes the contents of the index ROM 145 to be placed at the match index output lines 150 of the index ROM 145. The match index 150 may then be transferred to external circuitry for further processing or the match index 150 itself may provide the result required depending upon the application.

Inputs to the priority restriction circuit 170 are the search beyond address lines 162 from the word line decoder 160. A disable word line signal 175 is applied to the decoder 160. The disable word line signal 175, when activated, prevents the decoded word line address 165 from being applied to the rows of memory cells 110. This allows the decoded word line address to operate the search beyond address lines 162 to generate a decoded priority index address for restricting the search space of the CAM array 105.

The priority index address is the beginning address of the CAM array 105 that is to be effectively exempted from being searched for the presence of the comparand 120. The exempted addresses of the CAM array 105 are actually searched but the results are ignored. For multiple matched searches of the CAM array 105, the primary index address is found as described for a CAM array of the conventional art. The index address may then be applied through the address line 155 to the word line decoder 160 for a new but restricted search. Employing the exempted addresses, as described, allows the determining of the locations of multiple addresses matching the comparand 120. However, the conventional search is accomplished by not exempting any of the addresses of the CAM array 120.

The word line decoder 160 decodes the index address to select the appropriate search beyond address lines 162. The disable word line signal 175 is activated to prevent the index address from being applied to the word lines 165 and thus from the CAM array. The search beyond address lines 162, as connected to the priority restriction circuit, receive the decoded index address and when the Enable Search Beyond signal 180 is activated, the priority restriction circuit 170 sets those match result lines 130 having matches in the restricted address space to indicate that there is no match.

The adjusted match lines are then transferred to the restricted match result lines 185 for application to the priority encoder 135. The next match line 130 within the non-restricted address space is identified according to the priority of the priority encoder 135 is identified. The output signals 140 of the priority encoder 135 to the index ROM 145. The output signals 140 select the appropriate location of the index ROM 145, which then transfers the matching index address 150 to external circuitry for further processing or the match index 150 itself may provide the result required depending upon the application.

The newly retrieved index address may then be communicated to the word line address 155 for decoding by the word line decoder 160 for further restriction of the priority of the CAM array address space, for instance in "multimatch extraction" operation. Since no flags of the CAM array 105 are modified, any search within the CAM array 105 other than the search that results in multiple matches of the original comparand may be processed and not effect the searching that results in multiple matches of a given comparand.

The data contents of the rows of memory cells 110 are written with the data being placed on the bit lines 125 in a similar fashion as the comparand 20 is during a compare operation. Associated with placement of the data on the bit lines 125, the address 155 is applied to the word line decoder 160. The word line decoder 160 interprets the address 155 to select the word line 165 attached to the row of memory cells 110 into which the data is to be written. The disable word line signal 175 is deactivated and the data present on the bit lines 125 is written to the CAM array 105 at the row of memory cells 110 selected by the activated word line address 165.

Figure 3:
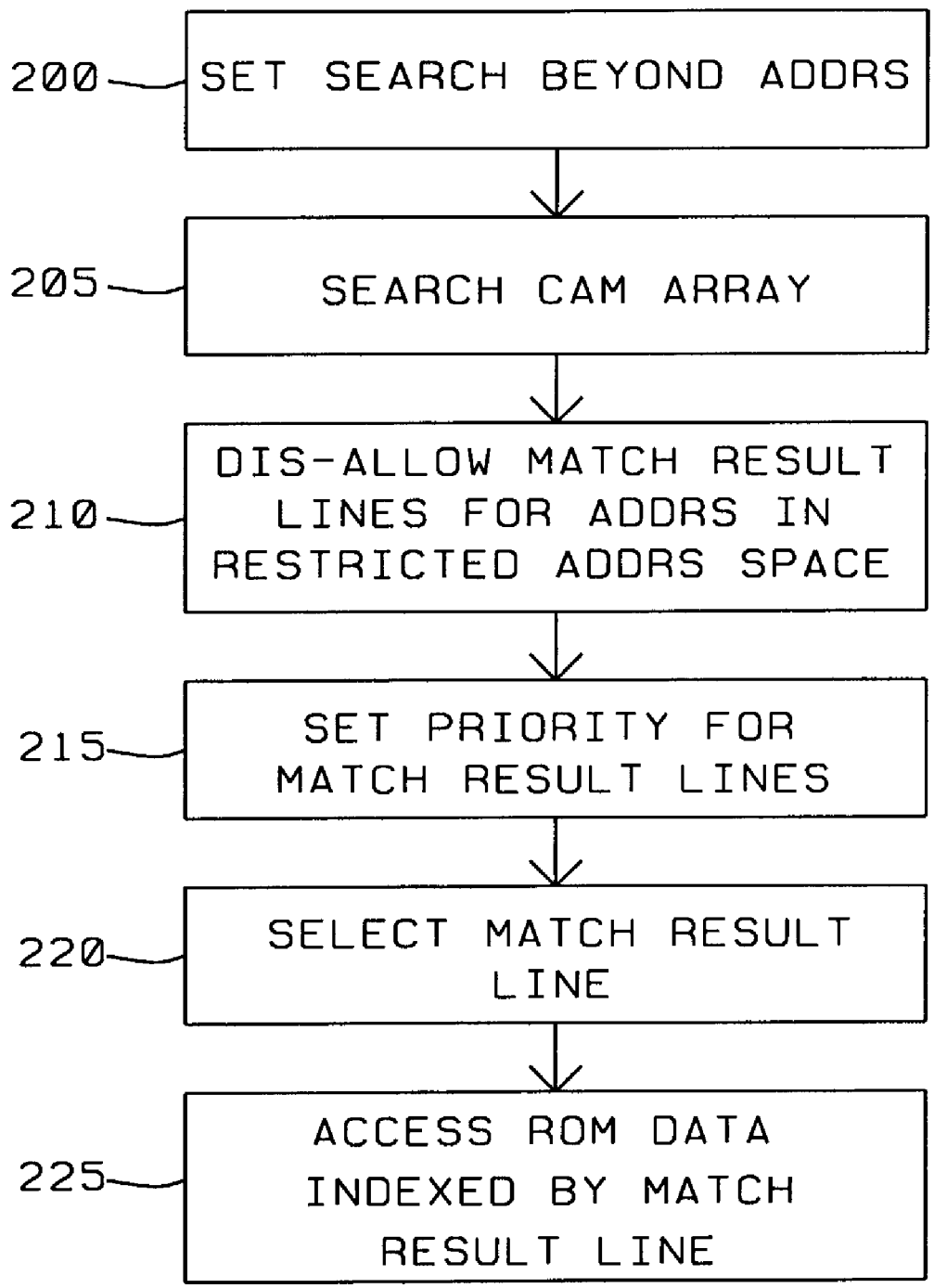
FIG. 3 is a flow diagram showing the method for restricting a search address space of a content addressable memory according to an embodiment of this invention.

Referring now to FIG. 3, the restricted search operation begins by setting (Box 200) the boundary address to define the restricted address space of the CAM array. The CAM array is searched (Box 205) to find all the contents matching the comparand, with those contents having a match indicated by an activated match result line. The match priority is set (Box 210) to disallow those match result lines representing addresses in the address space within the restricted address space. The priority of the matching addresses is established (Box 215) and the appropriate match line having the highest priority is selected (Box 220). The address ROM is indexed (Box 225) according to the selected match line. As described above, this process may be iterated until some or all of the indices of the matched contents for a given comparand value of the CAM array are identified.

Figure 4:
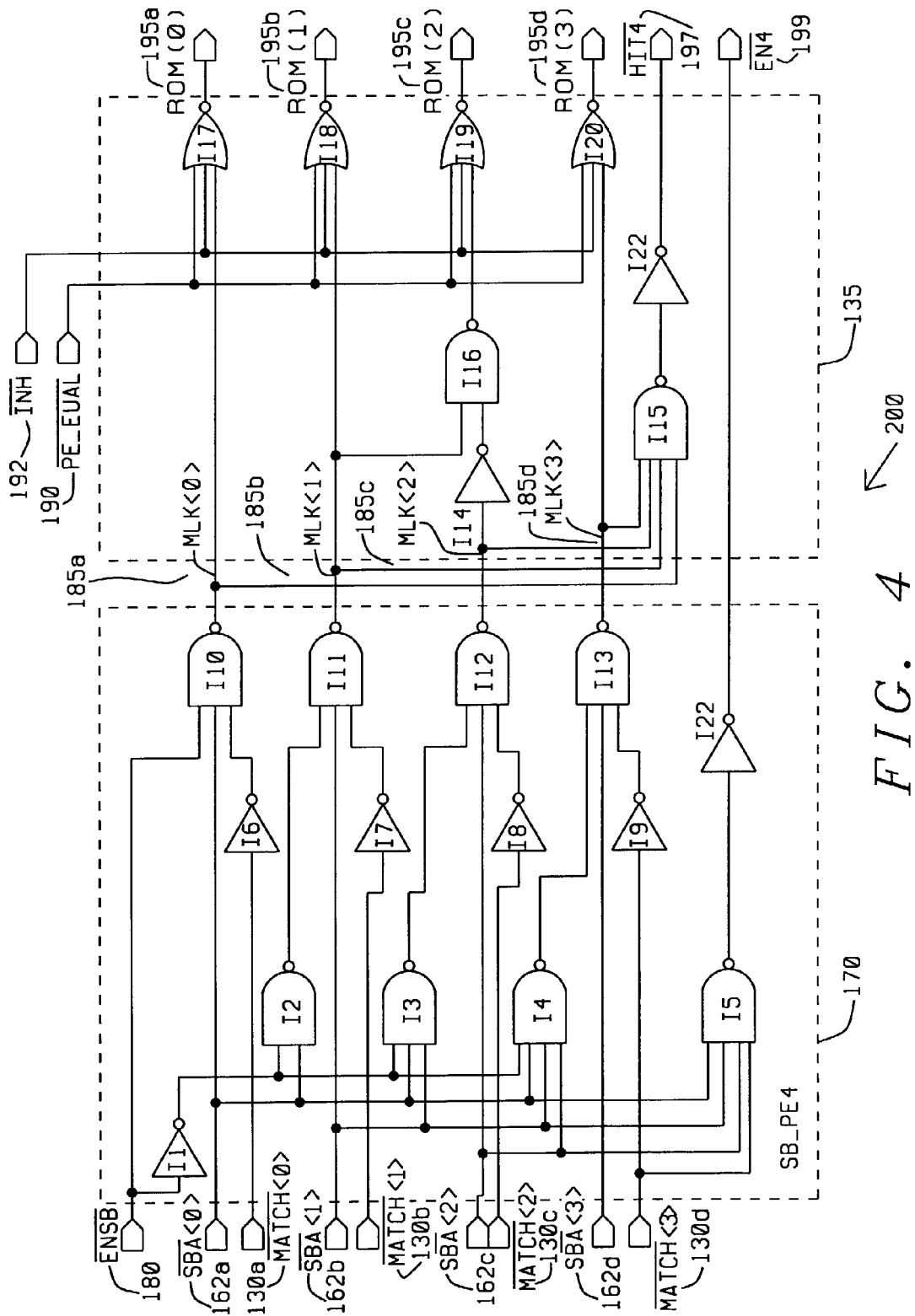
FIGS. 4–9 are schematic diagrams for a priority encoder having restricted priority according to an embodiment of this invention.
Figure 5:
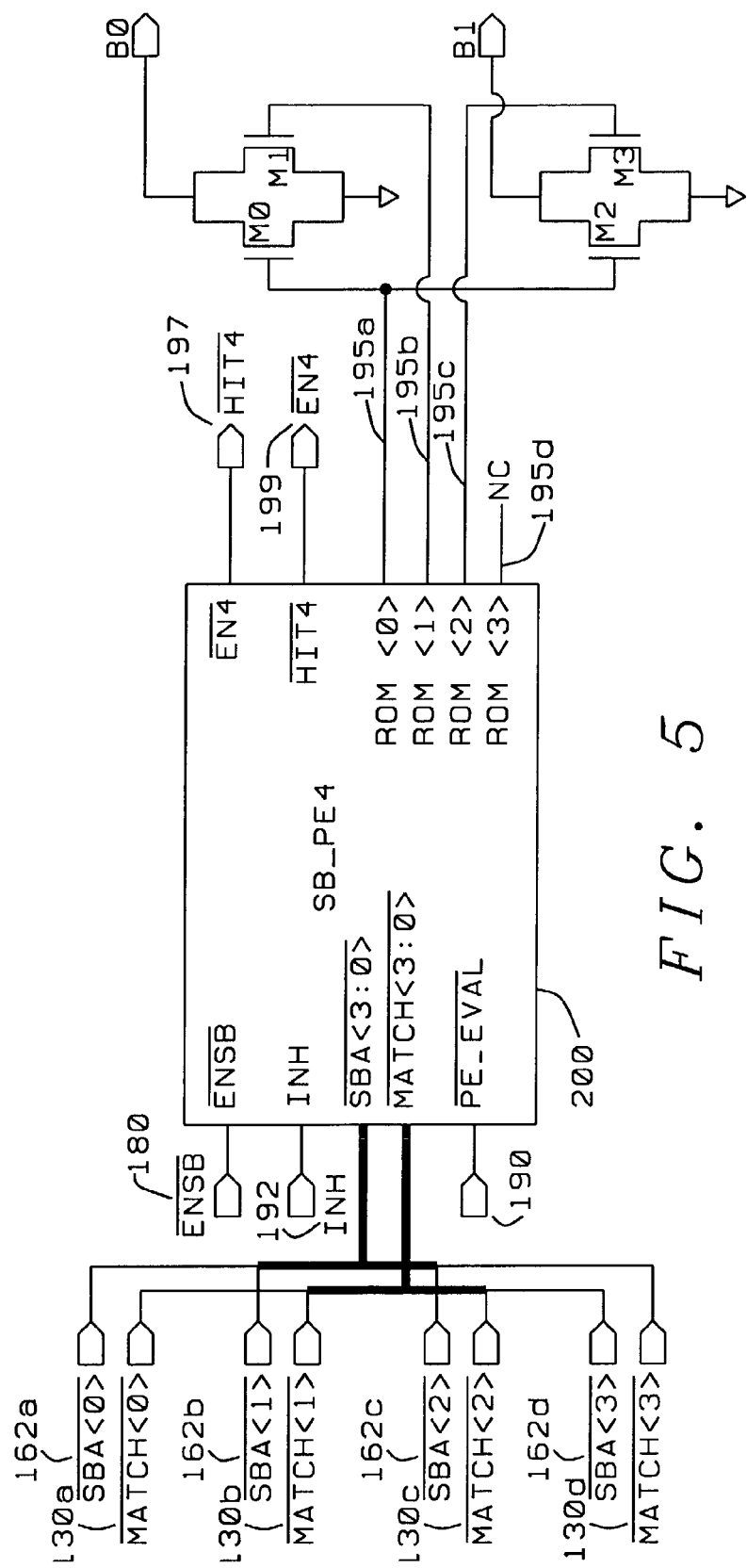
Figure 6:
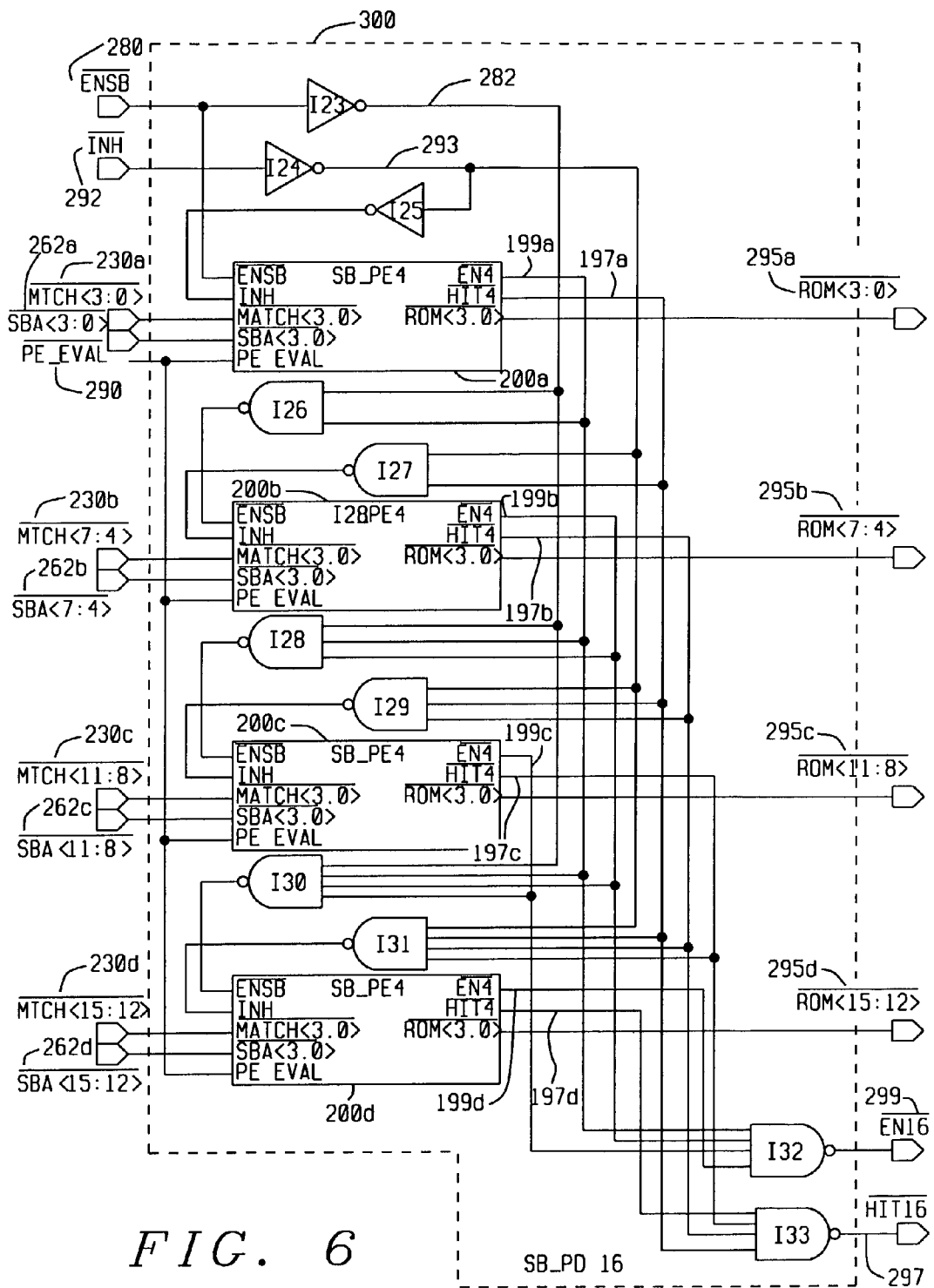
Figure 7:
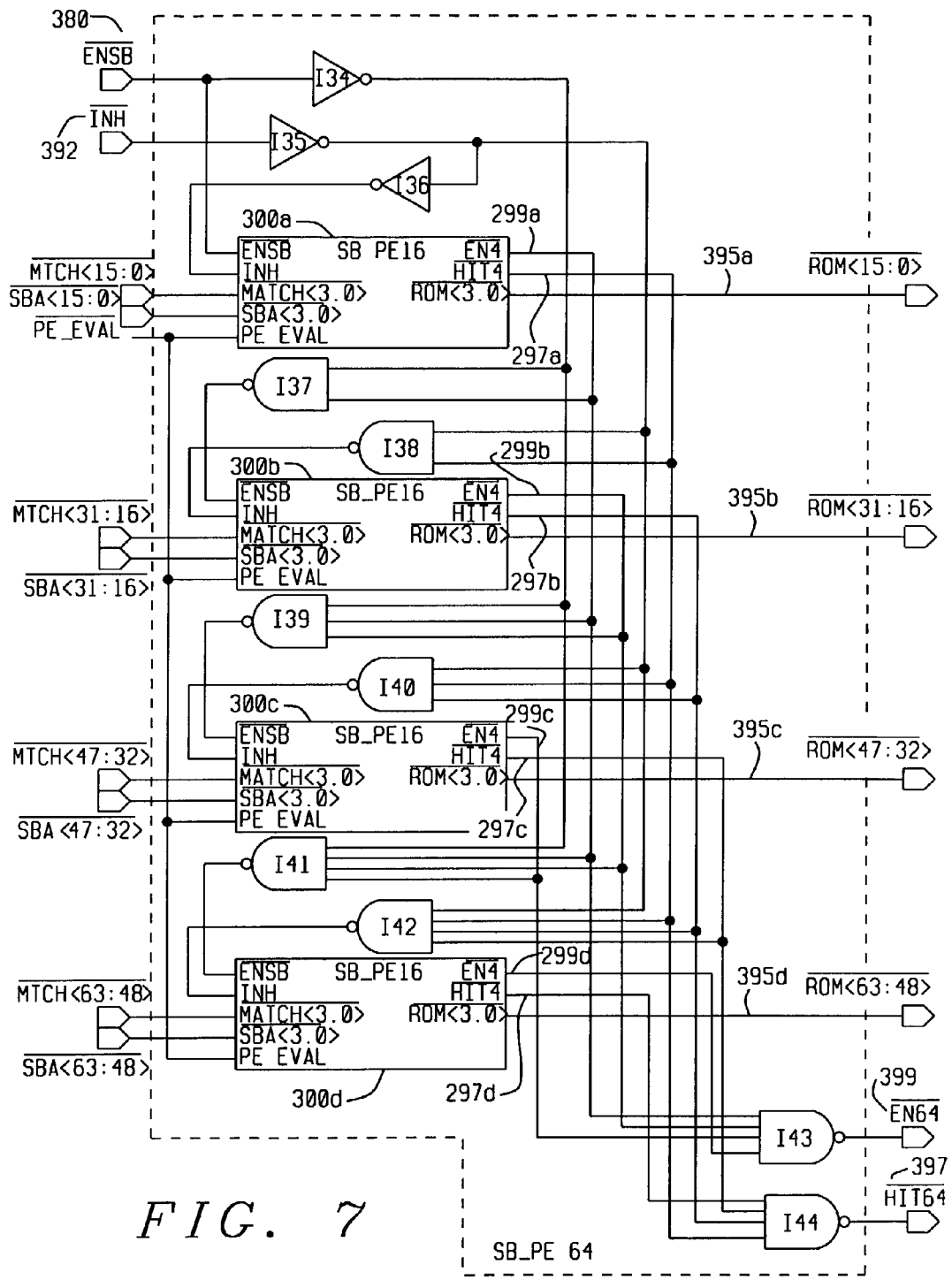
Figure 8:
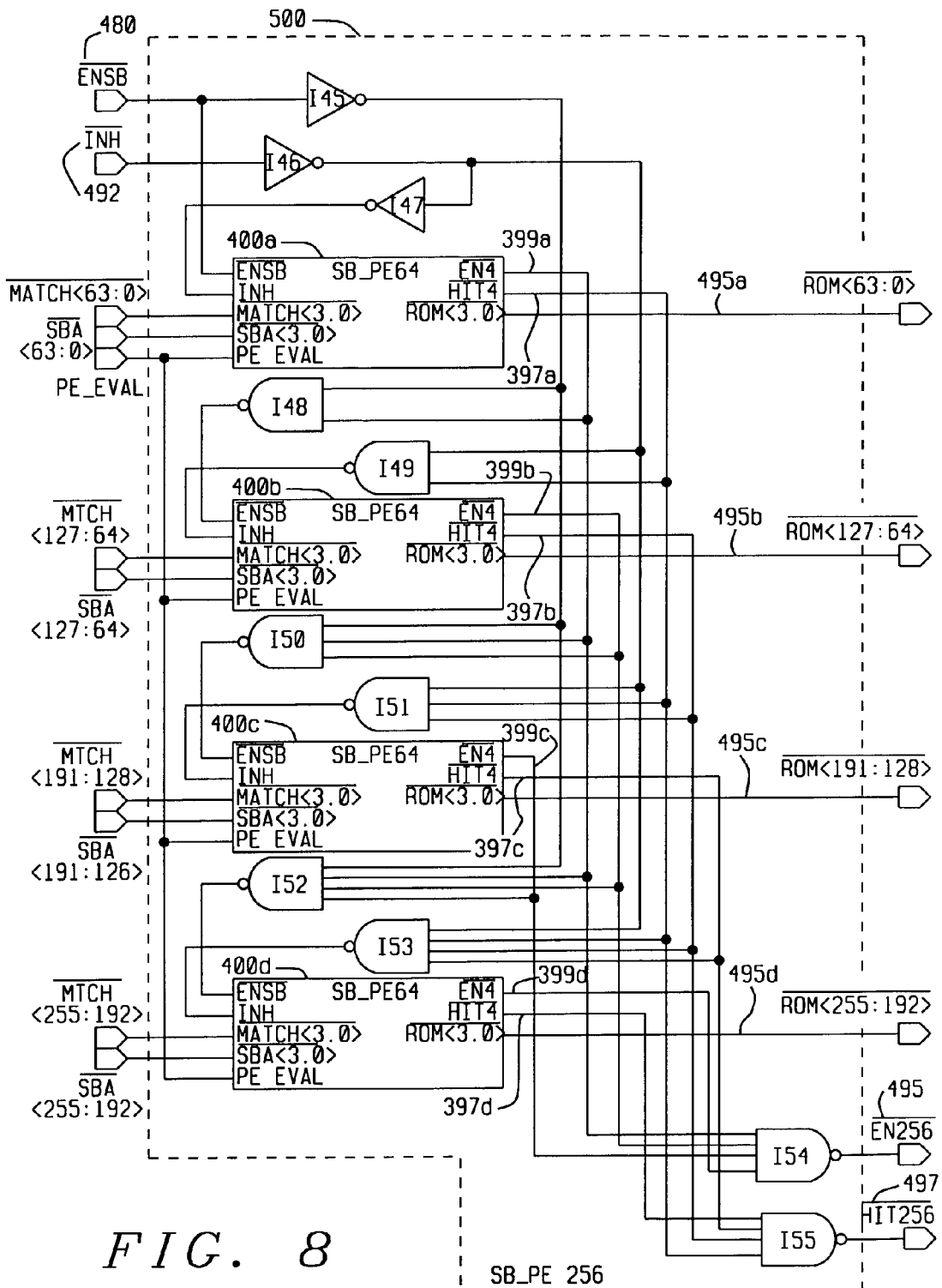

FIGS. 4–9 illustrate a combination of the priority restriction circuit 170 and the priority encoding circuit 135 of FIG. 2 for the preferred embodiment of a Content Addressable Memory of this invention. FIG. 4 shows the quad priority restriction encoding circuit 200 that is a combination of a portion of the priority restriction circuit 170 and portion of the priority encoding circuit 135 for four input match lines with the restricting being set by four lines of the decode of the index address. This quad priority restriction encoding circuit 200 as shown is a sub-circuit for a sixteen way priority restriction encoding circuit 300 for priority setting and encoding for sixteen input match result lines, as shown in FIG. 6. In turn, the sixteen way priority restriction encoding circuit 300 of FIG. 6 is a sub-circuit for the sixty-four way priority restriction encoding circuit 400 for priority setting and encoding for sixty-four lines, as shown in FIG. 7. The sixty-four-way priority restriction encoding circuit 400 of FIG. 7 is a sub-circuit for the 256-way priority restriction encoding circuit 500 of FIG. 8, which sets the priority and encodes 256 lines. The 256-way priority restriction encoding circuit 500 of FIG. 8 is a sub-circuit for the 512-way priority restriction encoding circuit 600 of FIG. 9, which sets the priority and encodes 512 lines.

In the preferred embodiment of this invention, the match result lines 130 of FIG. 2 from the CAM array 105 are active indicating a match of the row of cells 110 and the comparand 120 when the match result lines are at a voltage level indicating a logical zero. Alternately, non-match result lines are at the voltage level indicating a logical one. The decoded address as present on the search beyond address lines 162 of FIG. 2 similarly are active, indicating a previous match that is be the boundary of the restricted address space, when the search beyond address lines 162 are set to the voltage level of the logical zero and all other search beyond address lines 162 are inactive and set to the voltage level of the logical one.

In FIG. 4, the Enable Search Beyond signal $\overline{ENSB}$ 180 is connected to the inverter I1 and NAND gate I10. The output of the inverter I1 is connected to the NAND gates I2, I3, and I4 to permit the enabling of the search beyond function when the Enable Search Beyond signal $\overline{ENSB}$ 180 is set to the voltage level of the logical zero.

The search beyond address line $\overline{SBA<0>}$ 162a is connected to the NAND gates I2, I3, I4 and I5. The search beyond address line $\overline{SBA<1>}$ 162b is connected to the NAND gates I3, I4 and I5. The search beyond address line $\overline{SBA<2>}$ 162c is connected to the NAND gates I4 and I5. The search beyond address line $\overline{SBA<3>}$ 162d is connected to the NAND gate I5. During the search beyond function the search beyond address lines $\overline{SBA<0:3>}$ 162a, 162b, 162c, and 162d are transferred through the CAM array 105 of FIG. 2 and designate the address of the CAM array, which is to define the boundary of the search beyond function.

The match result lines 130a, 130b, 130c, and 130d are connected respectively to the through the inverters I6, I7, I8, and I9 to the NAND gates I10, I11, I12 and I13. The match result lines 130a, 130b, 130c, and 130d become active (logical zero), when the contents of a memory address is matched to a search of the CAM array 105 of FIG. 2. The outputs of the NAND gates I10, I11, I12 and I13 are the corresponding restricted match result lines 185a, 185b, 185c, and 185d, which contain the match result line values of the restricted range of addresses when the Enable Search Beyond signal $\overline{ENSB}$ 180 is activated or those of the full address range when the Enable Search Beyond signal $\overline{ENSB}$ 180 is deactivated.

The restricted match result lines 185a, 185b, 185c, and 185d are the inputs to the priority encoder circuit 135. The preferred implementation of the priority encoder 135 of this invention has the restricted match result lines 185a, 185b, and 185d connected respectively to the NOR gates I17, I18, and I20. The restricted match result line 185c is connected through the inverter I14 to the NAND gate I16. The second input of the NAND gate I16 is connected to the restricted match result line 185b. The output of the NAND gate I16 is connected to the NOR gate I19. The priority encoder evaluation pulse 190 and the inhibit pulse 192 are connected to the NOR gates I17, I18, I19 and I20 to provide timing and control for the priority encoder 135. The priority encoder evaluation pulse 190 is activated such that the output signals 195a, 195b, 195c, and 195d of the priority encoder 135 have the correct timing to activate the ROM address 140 of FIG. 2. The inhibit pulse 192 further provides a control signal to selectively allow the match result lines and thus the CAM array to be searched for indices contents that match the comparand beyond those found in the search of the CAM array, but in the restricted address area.

The inverter I14 and the NAND gate I16 provide additional blocking of the restricted match result line 185c when the restricted match line 185b is active to ensure the correct encoding at the output of the priority encoder 135.

The word lines 165a, 165b, 165c, and 165d are all connected to the NAND gate I5. The NAND gate I5 and the inverter I22 form an AND function of the word lines 165a, 165b, 165c, and 165d to create the enable output signal $\overline{EN4}$ 199 indicating that one of the word lines 165a, 165b, 165c, and 165d have been activated and that any subsequent address is in the range of the search during a search beyond operation. The restricted match result lines 185a, 185b, 185c, and 185d are connected to the NAND gate I15. The NAND gate I15 and the inverter I22 form the AND function that indicates that one of the restricted match result lines 185a, 185b, 185c, and 185d has been activated and one of these four addresses of the CAM array being searched have a match of its contents to the comparand. The output of the NAND gate I15 is the hit indicator signal $\overline{HIT4}$ 197 indicating the match.

The output signals 195a, 195b, and 195c of the priority encoder 135 are connected to the gates of the N-type metal oxide semiconductor transistors (NMOS) M0, M1, M2, and M3, as shown in FIG. 5. The drains of the NMOS transistors M0 and M1 are connected to form the bit address B0 and the drains of the NMOS transistors M2 and M3 are connected to form the bit address B1. The bit addresses B0 and B1 represent the encoded address 140 used to access the address ROM 145 of FIG. 2. The sources of the NMOS transistors M0, M1, M2, and M3 are connected to the ground reference supply to provide the voltage level for the logical zero when the NMOS transistors M0, M1, M2, and M3 are turned on. Table 1 shows the logical values of the bit addresses B0 and B1 corresponding to the values of the output signals 195a, 195b, 195c, and 195d.

TABLE 1

|  | B1 | B0 |
| --- | --- | --- |
| ROM<0> 195a | 0 | 0 |
| ROM<1> 195b | 1 | 0 |
| ROM<2> 195c | 0 | 1 |
| ROM<3> 195d | 1 | 1 |

The output signal 195d is not connected since the address evaluation of the ROM 145 of FIG. 2 requires the HIT indicator signal 197 for decoding the appropriate address. The bit addresses B0 and B1 having a voltage level of the logical 1 and indicating there has been a hit and that hit must be for the match result line 130d.

An example of the search beyond priority encoder circuit of this invention is presented hereinafter to provide an understanding of the operation of the circuit. In this first example, the search beyond function is disabled and the priority encoder operates in the conventional mode. The disable word line 175 of FIG. 2 is set to allow the word lines to operate correctly to provide normal comparison and timings. The Enable Search Beyond signal $\overline{ENSB}$ 180 is deactivated by being placed at the voltage level for a logical 1. All the word line signals present at the word lines 165a, 165b, 165c, and 165d are deactivated by being placed at the voltage level for a logical 1. If in this example a match between the searched comparand and the contents of the CAM array 105 of FIG. 2 occurs at each of the match result lines 130b and 130c, the match result lines 130b and 130c are set to the voltage level representing the logical zero. With no other matches within this portion of the CAM array 105, the remaining match result lines 130a and 130d are set to the voltage level of the logical 1. It can be shown that this combination of input signals causes the restricted match result lines 185a and 185d to the voltage level for the logical one and the restricted match result lines 185b and 185c are set to the voltage level of the logical zero. However, it further can be shown that only the output signal 195b of the priority encoder is set to the voltage level of the logical 1 and the remaining output signals 195a, 195c, and 195d are set to the voltage level of the logical zero. From table 1, it can be shown that the address bits B1 and B0 become respectively set to the voltage level for the logical zero and the logical 1 indicating that the contents of the address location 1 of the CAM array has precedence over all other matches in the CAM array.

The following is a second example of the search beyond priority encoder circuit according to the embodiments of this invention. In this example, the search beyond function is enabled and the priority encoder operates in the search beyond mode. The disable word line 175 of FIG. 2 is set to prevent the word lines 165 from operating to inhibit the normal comparison and timings and thus disturbing the cell contents of the CAM array 105. The Enable Search Beyond signal $\overline{ENSB}$ 180 is activated by being placed at the voltage level for a logical zero. One of the word line signals present at the search beyond address lines 162a, 162b, 162c, and 162d is activated by being placed at the voltage level for a logical zero. In this example, the search beyond address lines 162c is placed at the voltage level of the logical zero indicating that the search should begin with the addresses of the CAM array greater than the location indicated by the search beyond address lines 162c. If in this example, a match between the searched comparand and the contents of the CAM array 105 of FIG. 2 occurs on the match result lines 130b, 130c, and 130d, the match result lines 130b, 130c, and 130d are set to the voltage level representing the logical zero. With no other matches within this portion of the CAM array 105, the remaining match line 130a is set to the voltage level of the logical 1. It can be shown that this combination of input signals causes the restricted match line 185d to be placed at the voltage level for the logical zero and the restricted match result lines 185a, 185b, and 185c are set to the voltage level of the logical one. It can further be shown that only the output signal 195d of the priority encoder is set to the voltage level of the logical 1 and the remaining output signals 195a, 195b, and 195c are set to the voltage level of the logical zero. From table 1, it can be shown that the address bits B1 and B0 become set to the voltage level for the logical 1 indicating that the contents of the address location 3 of the CAM array has precedence over all other matches in the CAM array.

The NMOS transistors M0, M1, M2, and M3 of FIG. 5 in the preferred implementation are incorporated in the address evaluation circuitry of the ROM 145 of FIG. 2. Therefore, the structure of the priority encoder 135 provides the necessary codes to satisfy the particular implementation. It is apparent to one skilled in the art that the priority encoder 135 could be appropriately changed to provide what is referred to as a "one hot" output, where one output of the group of output is set indicating the selected address of the ROM 145 to be activated.

As shown in FIG. 6, the sixteen-way priority restriction encoding circuit 300 is formed by placing four of the quad priority restriction encoding circuits 200a, 200b, 200c, and 200d in parallel. The Enable Search Beyond signal 280 is connected to the enable search beyond terminal 180 of the quad priority restriction encoding circuit 200a and the inverter I23. The inverted search beyond signal 282 is distributed from the output of the inverter I23 to the NAND gates I26, I28, and I30.

The inhibit signal 292 is transferred through the inverters I24 and I25 to the inhibit input (INH) of the quad priority restriction encoding circuit 200a. The inverted inhibit signal 293 is transferred from the output of the inverter I24 to the input of the NAND gates I27, I29, and I31.

The match signals 230a provide the indications of any matches of the comparand to the contents of the CAM array for the first four address locations (0–3) to the quad priority restriction encoding circuit 200a. The match signals 230b provide the indications of any matches of the comparand to the contents of the CAM array for the second four address locations (4–7) to the quad priority restriction encoding circuit 200b. The match signals 230c provide the indications of a match of the comparand to the contents of the CAM array for the third four address locations (8–11) to the quad priority restriction encoding circuit 200c. The match signals 230d provide the indications of any matches of the comparand to the contents of the CAM array for the fourth four address locations (12–15) to the quad priority restriction encoding circuit 200d.

The search beyond address lines 262a provide the restriction boundary address for the searched beyond function for the first four address locations (0–3) to the quad priority restriction encoding circuit 200a. The search beyond address lines 262b provide the restriction boundary address for the searched beyond function for the first four address locations (4–7) to the quad priority restriction encoding circuit 200b. The search beyond address lines 262c provide the restriction boundary address for the searched beyond function for the first four address locations (7–11) to the quad priority restriction encoding circuit 200c. The search beyond address lines 262d provide the restriction boundary address for the searched beyond function for the first four address locations (12–15) to the quad priority restriction encoding circuit 200d.

The priority encoder evaluation pulse 190 is connected to the quad priority restriction encoding circuits 200a, 200b, 200c, and 200d to provide necessary timing signals such that when activated such that the output signals 295a, 295b, 295c, and 296d of the quad priority restriction encoding circuits 200a, 200b, 200c, and 200d have the correct timing to activate the address ROM 145 of FIG. 2.

The quad priority restriction encoding circuits 200a, 200b, 200c, and 200d function as described above for FIG. 4 to provide the output signals 295a, 295b, 295c, and 295d of the quad priority restriction encoding circuits 200a, 200b, 200c, and 200d to activate the address ROM 145 of FIG. 2. Further, the quad priority restriction encoding circuits 200a, 200b, 200c, and 200d generate the respective enable output signals 199a, 199b, 199c, and 199d indicating that a word line within the quad priority restriction encoding circuits 200a, 200b, 200c, and 200d has a restriction of the search address within the address space of one of the particular quad priority restriction encoding circuits 200a, 200b, 200c, and 200d. The quad priority restriction encoding circuits 200a, 200b, 200c, and 200d further generate the respective HIT indicator signals $\overline{HIT4}$ 197a, 197b, 197c, and 197d indicating that of the quad priority restriction encoding circuits 200a, 200b, 200c, and 200d have one of the restricted match result lines 185a, 185b, 185c, and 185d active indicating a match of a comparand and the contents of the CAM array within the address space of the particular quad priority restriction encoding circuit 200a, 200b, 200c, or 200d.

The second input of the NAND gate I26 is connected to receive the enable output signal 199a from the quad priority restriction encoding circuit 200a. The NAND gate I26 logically combines the inverted search beyond signal 282 and the enable output signal 199a of the quad priority restriction encoding circuit 200a to enable the quad priority restriction encoding circuit 200b. The second and third inputs of the NAND gate I28 are respectively connected to receive the enable output signals 199a and 199b from the quad priority restriction encoding circuits 200a and 200b. The NAND gate I28 logically combines the inverted search beyond signal 282 and the enable output signals 199a and 199b of the quad priority restriction encoding circuits 200a and 200b to enable the quad priority restriction encoding circuit 200c. Similarly, the second, third, and fourth inputs of the NAND gate I30 are respectively connected to receive the enable output signals 199a, 199b, and 199c from the quad priority restriction encoding circuits 200a, 200b and 200c. The NAND gate I30 logically combines the inverted search beyond signal 282 and the enable output signals 199a, 199b and 199c of the quad priority restriction encoding circuits 200a, 200b and 200c to enable the quad priority restriction encoding circuit 200d.

The second input of the NAND gate I27 is connected to receive the HIT indicator signal 197a from the quad priority restriction encoding circuit 200a. The NAND gate I27 logically combines the inverted inhibit signal 293 and the HIT indicator signal 197a of the quad priority restriction encoding circuit 200a to provide the inhibit signal the quad priority restriction encoding circuit 200b. The second and third inputs of the NAND gate I29 are respectively connected to receive the HIT indicator signals 197a and 197b from the quad priority restriction encoding circuits 200a and 200b. The NAND gate I29 logically combines the inverted inhibit signal 293 and the HIT indicator signals 197a and 197b of the quad priority restriction encoding circuits 200a and 200b to the inhibit signal to the quad priority restriction encoding circuit 200c. Similarly, the second, third, and fourth inputs of the NAND gate I31 are respectively connected to receive the HIT indicator signals 197a, 197b, and 197c from the quad priority restriction encoding circuits 200a, 200b and 200c. The NAND gate I31 logically combines the inverted inhibit signal 293 and the HIT indicator signals 197a, 197b and 197c of the quad priority restriction encoding circuits 200a, 200b and 200c to provide the inhibit signals to the quad priority restriction encoding circuit 200d.

The enable output signals 199a, 199b, 199c, and 199d are transferred from quad priority restriction encoding circuits 200a, 200b, 200c, and 200d to the NAND gate I32, where they are logically combined to form the sixteen-way enable output signal 299. When active, the sixteen-way enable output signal 299 indicates one of the word lines 265a, 265b, 265c, and 265d within the sixteen-way priority encoder 300 have been enabled to act as the boundary for the restriction of the priority to allow search beyond a given address.

The HIT indicator signals $\overline{HIT4}$ 197a, 197b, 197c, and 197d are transferred from quad priority restriction encoding circuits 200a, 200b, 200c, and 200d to the NAND gate I33, where they are logically combined to form the sixteen-way HIT indicator signal $\overline{HIT16}$ 297. When active, the sixteen-way HIT indicator signal $\overline{HIT16}$ 297 indicates at least one of the match result lines 230a, 230b, 230d, and 230d within the sixteen-way priority encoder 300 have been enabled to indicate that the comparand matches the contents of at least one of the CAM array addresses.

The following provides a first example of the sixteen-way priority restriction encoding circuit 300 in which the search beyond function is disabled and the priority encoder operates in the conventional mode. The disable word line 175 of FIG. 2 is set to allow the word lines to operate correctly to provide normal comparison, timings, and data access. The Enable Search Beyond signal $\overline{\text{ENSB}}$ 280 is deactivated by being placed at the voltage level for a logical 1. All the search beyond address signals present at the search beyond address lines 262a, 262b, 262c, and 262d are deactivated by being placed at the voltage level for a logical 1. If in this example a match between the searched comparand and the contents of the CAM array 105 of FIG. 2 occurs on one of the match lines of each set of match result lines 230b and 230c, the individual match result line of the set of match lines 230b and 230c are set to the voltage level representing the logical zero. With no other matches within this portion of the CAM array 105, the remaining match result lines of the set of match result lines 230b and 230c and all the match result lines of the set of match result lines 230a and 230d are set to the voltage level of the logical 1. It can be shown that this combination of input signals causes the output signals 295a, 295c, and 295d of the quad priority restriction encoding circuits 200a, 200c, and 200d are the voltage level for the logical zero. The one output signal of the set of output signals 295b of the quad priority restriction encoding circuit 200b representing the one match result line of the set of match result lines 230b where the contents of the CAM array that matches the comparand is set to the voltage level of the logical 1. The remaining output signals of the set of output signals 295b of the quad priority restriction encoding circuit 200b are set to the voltage level of the logical zero.

In a second example of the sixteen-way priority restriction encoding circuit 300 of this invention, the search beyond function is enabled and the priority encoder operates in the search beyond mode. The disable word line 175 of FIG. 2 is set to prevent the word lines 165 unwanted cell access. The Enable Search Beyond signal $\overline{\text{ENSB}}$ 280 is activated by being placed at the voltage level for a logical zero. One of the word line signals present at the search beyond address lines 262a, 262b, 262c, and 262d are activated by being placed at the voltage level for a logical zero. In this example, one of the set of search beyond address lines 262c is placed at the voltage level of the logical zero indicating that the search should effectively begin with the addresses of the CAM array greater than the location indicated by the word line of the set of search beyond address lines 162c, even though the entire CAM array 205 is searched, with the results outside the restricted area being ignored. If in this example a match between the applied comparand and the contents of the CAM array 105 of FIG. 2 occurs on one of each of the sets of match result lines 230b, 230c, and 230d, the match result lines indicating the match to the comparand of the set of match result lines 230b, 230c, and 230d are set to the voltage level representing the logical zero. With no other matches within this portion of the CAM array 105, the remaining match result lines of the set of match result lines 230b, 230c, and 230d are set to the voltage level of the logical 1, as are all the match result lines of the set of match result lines 230a. It can be shown that this combination of input signals causes the output signal of the set of output signals 295d corresponding to the match result line of the set of match result lines 230d having the match to the comparand is set to the voltage level of the logical 1 and the remaining output signals of the set of output signals 295d and all the output signals of the sets of output signals 295a, 295b, and 295c are set to the voltage level of the logical zero.

Each of the output signals of the sets of output signals 295a, 295b, 295c, and 295d are connected to NMOS transistors M0, M1, M2, and M3 similar to that described in FIG. 5. The structure as described in FIG. 5 allows the creation of the appropriate address of the ROM 145 of FIG. 2 indicating the index of the highest priority address of the contents matching the comparand within the CAM array 105.

Referring now to FIG. 7, the sixty-four-way priority restriction encoding circuit 400 is formed of four sixteen-way priority restriction encoding circuits 300a, 300b, 300c, or 300d. The Enable Search Beyond signal $\overline{\text{ENSB}}$ 380 is logically combined with the sixteen-way enable output signals 299a, 299b, 299c, and 299d to activate or deactivate the search beyond function within the four sixteen-way priority restriction encoding circuits 300a, 300b, 300c, or 300d. Similarly the inhibit signal 392 is logically combined with the sixteen-way HIT indicator signals $\overline{\text{HIT16}}$ 297a, 297b, 297c, and 297d to activate or deactivate the inhibit function within the four sixteen-way priority restriction encoding circuits 300a, 300b, 300c, or 300d. Thus, the four sixteen-way priority restriction encoding circuits 300a, 300b, 300c, or 300d are appropriately activated to set the priority address for the output signal of the sets of output signals 395a, 395b, 395c, and 395d analogous to that described in FIG. 6.

The 256-way priority restriction encoding circuit 500 of FIG. 8 is formed of four sixty-four-way priority restriction encoding circuits 400a, 400b, 400c, or 400d. The Enable Search Beyond $\overline{\text{ENSB}}$ signal 380 is logically combined with the sixty-four-way enable output signals 399a, 399b, 399c, and 399d to activate or deactivate the search beyond function within the four sixty-four-way priority restriction encoding circuits 400a, 400b, 400c, or 400d. Similarly the inhibit signal 392 is logically combined with the sixty-four-way HIT indicator signals $\overline{\text{HIT64}}$ 397a, 397b, 397c, and 397d to activate or deactivate the inhibit function within the four sixty-four-way priority restriction encoding circuits 400a, 400b, 400c, or 400d. Thus, the four sixty-four-way priority restriction encoding circuits 400a, 400b, 400c, or 400d are appropriately activated to set the priority address for the output signal of the sets of output signals 495a, 495b, 495c, and 495d analogous to that described in FIG. 6.

Figure 9:
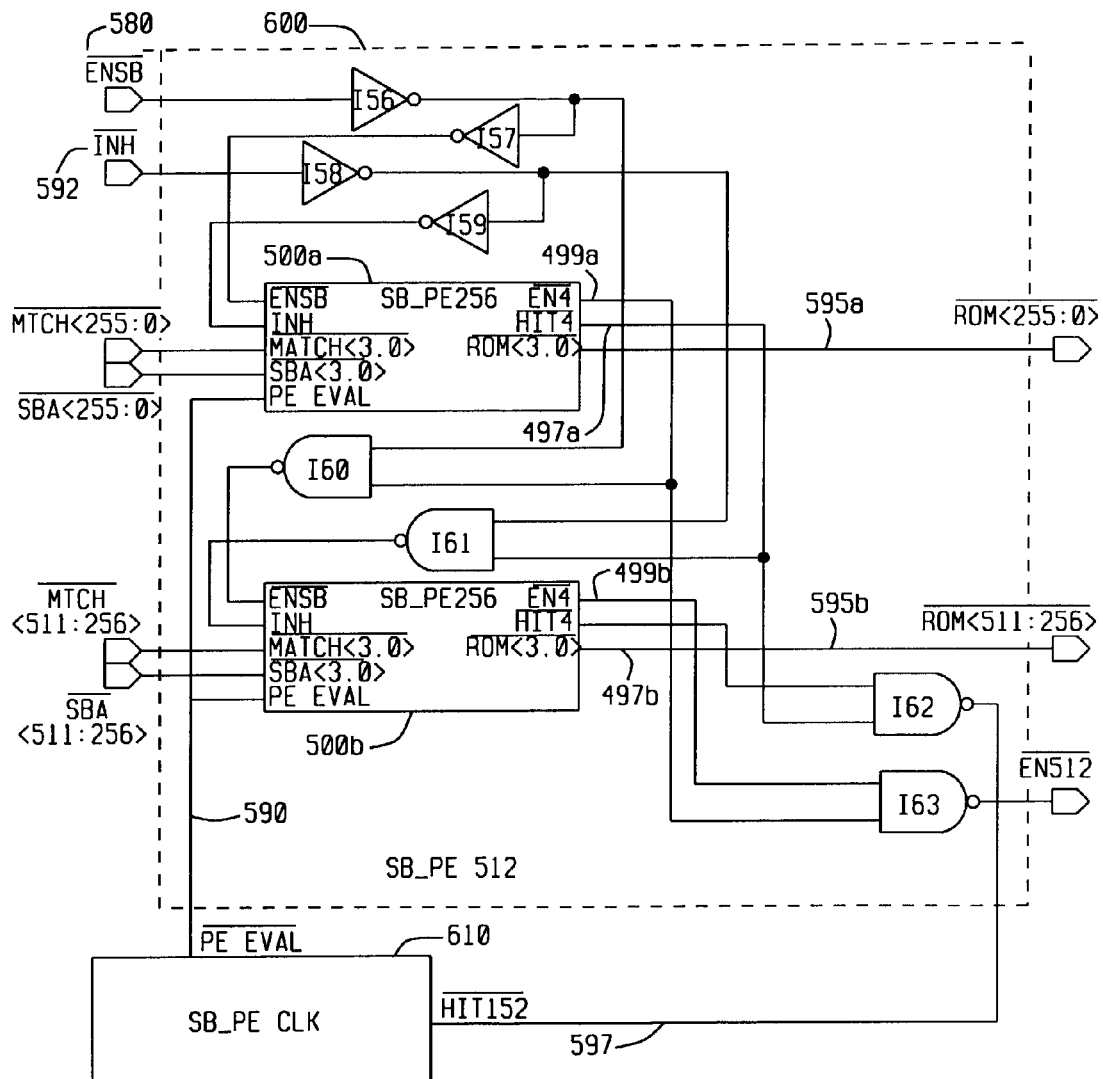

The 512-way priority restriction encoding circuit 600 of FIG. 9 is formed of two 256-way priority restriction encoding circuits 500a and 500b. The Enable Search Beyond signal $\overline{\text{ENSB}}$ 580 is logically combined with the 256-way enable output signal 499a to activate or deactivate the search beyond function within the four 256-way priority restriction encoding circuits 500a and 500b. Similarly the inhibit signal 592 is logically combined with the 256-way HIT indicator signal $\overline{\text{HIT256}}$ 497a to activate or deactivate the inhibit function within the four 256-way priority restriction encoding circuits 500a and 500b. Thus, the four 256-way priority restriction encoding circuits 500a and 500b are appropriately activated to set the priority address for the output signal of the sets of output signals 495a, 495b, 495c, and 495d analogous to that described in FIG. 6.

The 512-way HIT indicator signal $\overline{\text{HIT512}}$ 597 is an input to the search beyond priority encoder clocking circuit 610. The search beyond priority encoder clocking circuit 610 upon receipt of the 512-way HIT indicator signal $\overline{\text{HIT512}}$ 597 and at the appropriate timing interval provides the priority encoder evaluation pulse 590.

It is apparent to those skilled in the art that the structure of the restricted priority encoder circuit of this invention may structure to have various address depths dependent upon the number of words within the CAM array. The basic quad priority restriction encoding circuit 200 of FIG. 4 may be expanded as described above to process any number of CAM array match result lines.

While this invention has been particularly shown and described with reference to the preferred embodiments thereof, it will be understood by those skilled in the art that various changes in form and details may be made without departing from the spirit and scope of the invention.

The invention claimed is:

1. A priority encoder for receiving a plurality of input signals and from said input signals generating output signals in accordance with an alterable priority sequence, said priority encoder comprising:
   a plurality of input circuits to receive said input signals from a content addressable memory (CAM) array;
   a CAM array word line decoder coupled to the CAM array that accesses locations of the CAM array and generates at least one priority transformation signal in response to a received address value;
   a priority setting circuit for receiving the at least one priority transformation signal that indicates a priority index for modification of said priority sequence;
   an encoding circuit in communication with said plurality of input circuits and said priority setting circuit for generating said output signals in accordance with said priority sequence; and
   an enabling circuit for receiving an enabling signal and for communicating said enabling signal to said encoding circuit, such that upon deactivation of said enabling signal, said encoding circuit generates said output signals in accordance with said priority sequence with no modification by said priority setting circuit.

2. The priority encoder circuit of claim 1 wherein said input signals are match signals of the CAM array and said priority index indicates a region of said CAM array exempted from effective comparison.

3. The priority encoder circuit of claim 2 wherein said priority index is an index address of said CAM array determined with a previous search of said content addressable memory and applied to the CAM array word line decoder.

4. The priority encoder of claim 1 wherein said CAM array word line decoder has a first mode for providing word line addresses to said CAM array and a second mode for providing said priority index to said priority setting circuit.

5. A circuit for restricting a search space in a content addressable memory, comprising a content addressable memory (CAM) array word line decoder that receives an incoming index and provides a decoded output to an encoder circuit, wherein said CAM array word line decoder is a word line decoder for said content addressable memory and has a first mode for accessing locations of a CAM array by activating word lines of the CAM array and a second mode for providing said priority index to said priority setting circuit in response to the incoming index value.

6. The circuit of claim 5 further comprising:
   a plurality of input circuits to receive match signals from said content addressable memory; and
   a priority setting circuit for receiving the decoded output indicating a priority index for modification of a priority sequence of said search space from said incoming index.

7. The circuit of claim 5 wherein said encoder is in communication with said plurality of input circuits and said priority setting circuit for generating an output index signal in accordance with said priority sequence indicating a match location within said CAM array.

8. The circuit of claim 7 further comprises an enabling circuit for receiving an enabling signal and for communicating said enabling signal to said priority setting circuit and said encoder, such that upon deactivation of said enabling signal, said encoder generates said output index signal in accordance with said priority sequence with no modification by said priority setting circuit.

9. The circuit of claim 6 wherein said priority index indicates a region of said CAM array exempted from effective comparison.

10. The circuit of claim 5 wherein said incoming index is an index address of said CAM array determined with a previous search of said CAM array.

11. A method for restricting a search space in a content addressable memory, comprising the steps of:
   searching said content addressable memory (CAM) to create a first match result index according to a first prioritization of the CAM;
   setting the first match result index to define a restricted address space of said CAM to form a second prioritization of the CAM;
   after searching said CAM to create the first match result index, searching said CAM according to the second prioritization of the CAM; and
   disallowing match result addresses of said CAM outside of said restricted address space.

12. The method of claim 11 further comprising the steps of:
   setting a priority of said match result addresses;
   after disallowing match result addresses of said CAM outside of said restricted address space, in the event of match result, selecting at least one match result address from within the restricted search space and according to the priority; and
   creating an output index from said selected match result address.

13. The method of claim 11 wherein said priority index indicates a region of said CAM exempted from effective comparison.

14. The method of claim 11 wherein setting said highest priority index includes the steps of:
   receiving said highest priority index by a word line decoder of said CAM;
   said word line decoder performing the steps of:
      operating in a first mode, said first mode comprising the step of decoding word line addresses for said CAM, and
      operating in a second mode, said second mode comprising said step of decoding said highest priority index to set said restricted address space.

15. An apparatus for restricting a search space in a content addressable memory, comprising:
   means for setting a highest priority index to define a restricted address space of said content addressable memory, said means for setting the highest priority index including means for receiving said highest priority index by a word line decoder of said content addressable memory that accesses searchable locations of the content addressable memory;
   means for searching said content addressable memory; and
   means for disallowing match result addresses of said content addressable memory outside of said restricted address space.

16. The apparatus of claim 15 further comprising:
   means for setting a priority of said match result addresses;
   means for selecting said match result addresses; and
   means for creating an output index from said match result address.

17. The apparatus of claim 15 wherein said priority index indicates a region of said content addressable memory exempted from effective comparison.

18. The apparatus of claim 15 wherein said highest priority index is an index address of said content addressable memory determined with a previous search of said content addressable memory.

19. The apparatus of claim 16 wherein said means for creating said output index comprises:
- means for searching said content addressable memory to create a first match result address having a highest priority; and
- means for setting said first match result address as said highest priority index to constrain said restricted address space;

wherein means for creating said output index functions repeatedly to create multiple output indices.

20. The apparatus of claim 15 wherein:
said word line decoder performs the steps of:
- operating in a first mode, said first mode comprising the step of decoding word line addresses for said content addressable memory, and
- operating in a second mode, said second mode comprising said step of decoding said highest priority index to set said restricted address space.

* * * * *